(12) United States Patent
Xu et al.

(10) Patent No.: US 11,580,904 B2
(45) Date of Patent: Feb. 14, 2023

(54) TRANSPARENT DISPLAY PANELS AND DISPLAY PANELS

(71) Applicant: KunShan Go-Visionox Opto-Electronics Co., Ltd., Kunshan (CN)

(72) Inventors: Ji Xu, Kunshan (CN); Junhui Lou, Kunshan (CN); Chuanzhi Xu, Kunshan (CN); Miao Chang, Kunshan (CN); Lu Zhang, Kunshan (CN)

(73) Assignee: KunShan Go-Visionox Opto-Electronics Co., Ltd., Kunshan (CN)

(*) Notice: Subject to any disclaimer, the term of this patent is extended or adjusted under 35 U.S.C. 154(b) by 0 days.

(21) Appl. No.: 17/501,345

(22) Filed: Oct. 14, 2021

(65) Prior Publication Data
US 2022/0036817 A1  Feb. 3, 2022

Related U.S. Application Data

(63) Continuation of application No. PCT/CN2020/095454, filed on Jun. 10, 2020.

(30) Foreign Application Priority Data

Sep. 30, 2019  (CN) .......................... 201910940274.1

(51) Int. Cl.
  *G09G 3/3225*  (2016.01)
  *G09G 3/3216*  (2016.01)
(52) U.S. Cl.
  CPC ......... *G09G 3/3225* (2013.01); *G09G 3/3216* (2013.01); *G09G 2300/0426* (2013.01);
  (Continued)

(58) Field of Classification Search
  CPC ............... G09G 3/3225; G09G 3/3216; G09G 2300/0426; G09G 2300/0439;
  (Continued)

(56) References Cited

U.S. PATENT DOCUMENTS 8,344,616 B2   1/2013 Sim et al.
2008/0035932 A1   2/2008 Oh
(Continued)

FOREIGN PATENT DOCUMENTS

CN   101853876 A   10/2010
CN   102024421 A   4/2011
(Continued)

OTHER PUBLICATIONS

State Intellectual Property Office of the People's Republic of China, Office Action and Search Report Issued in Application No. 201910940274.1, dated Jan. 6, 2021, 16 pages.
(Continued)

*Primary Examiner* — Adam R. Giesy
(74) *Attorney, Agent, or Firm* — Maier & Maier, PLLC

(57) ABSTRACT

A transparent display panel and a display panel. The transparent display panel includes a transparent display area. The transparent display area includes a plurality of first pixel units. Each of the first pixel units includes a plurality of first sub-pixels. Each of the first sub-pixels includes: a first electrode being light-transmitting; a first light-emitting structural block located on the first electrode; and a second electrode located on the first light-emitting structural block. At least one pixel driving circuit for driving the first sub-pixels to emit light is arranged outside of the transparent display area. A separating area is arranged between an area where the at least one pixel driving circuit is arranged and the transparent display area.

18 Claims, 8 Drawing Sheets

(52) U.S. Cl.
CPC ............... *G09G 2300/0439* (2013.01); *G09G 2300/0456* (2013.01); *G09G 2300/0842* (2013.01); *G09G 2320/02* (2013.01); *G09G 2320/0209* (2013.01); *G09G 2320/0219* (2013.01)

(58) Field of Classification Search
CPC ... G09G 2300/0456; G09G 2300/0842; G09G 3/3208; H01L 27/00; H01L 27/3272
See application file for complete search history.

(56) References Cited

U.S. PATENT DOCUMENTS

| | | | |
|---|---|---|---|
| 2011/0063267 A1 | 3/2011 | Sim et al. | |
| 2018/0292719 A1 | 10/2018 | Yu | |
| 2018/0308912 A1* | 10/2018 | Kim | ................ H01L 51/5206 |
| 2021/0065625 A1* | 3/2021 | Wang | ................ G09G 3/2074 |

FOREIGN PATENT DOCUMENTS

| | | |
|---|---|---|
| CN | 103915475 A | 7/2014 |
| CN | 106783845 A | 5/2017 |
| CN | 107610635 A | 1/2018 |
| CN | 208013662 U | 10/2018 |
| CN | 109728000 A | 5/2019 |
| CN | 110265455 A | 9/2019 |
| KR | 1020090006996 A | 1/2009 |

OTHER PUBLICATIONS

State Intellectual Property Office of the People's Republic of China, Office Action and Search Report Issued in Application No. 201910940274.1, dated Mar. 24, 2021, 18 pages.
ISA State Intellectual Property Office of the People's Republic of China, International Search Report Issued in Application No. PCT/CN2020/095454, dated Sep. 15, 2020, WIPO, 5 pages.
ISA State Intellectual Property Office of the People's Republic of China, Written Opinion of the International Searching Authority Issued in Application No. PCT/CN2020/095454, dated Sep. 15, 2020, WIPO, 6 pages.
State Intellectual Property Office of the People's Republic of China, Office Action and Search Report Issued in Application No. 201910940274.1, dated Jun. 8, 2021, 21 pages.
State Intellectual Property Office of the People's Republic of China, Decision of Rejection Issued in Application No. 2019109402741, dated Aug. 19, 2021, 13 pages.

* cited by examiner

TRANSPARENT DISPLAY PANELS AND DISPLAY PANELS

CROSS-REFERENCE TO RELATED APPLICATIONS

This application is a continuation application of International Application No. PCT/CN2020/095454, filed on Jun. 10, 2020, which claims priority to Chinese Patent Application No. 201910940274.1, filed on Sep. 30, 2019, both of which are incorporated herein by reference in their entireties.

TECHNICAL FIELD

This application relates to a field of display device technology, and in particular, to transparent display panels and display panels.

BACKGROUND

With rapid development of display devices, users have increasingly higher requirements on screen-to-body ratio. Because the top of the screen needs to install components such as cameras, sensors and earphones, a part area on the top of the screen is usually reserved for the installation of the above components, for example, the "notch" area of the iPhone X, which affects the overall consistency of the screen. The full-screen display is receiving more and more attention from the industry.

SUMMARY

An objective of the present application is to provide a transparent display panel and a display panel for a full screen.

In order to achieve the objective, a first aspect of the present application provides a transparent display panel, including: a transparent display area, where the transparent display area includes a plurality of first pixel units, each of the first pixel units includes a plurality of first sub-pixels, and each of the first sub-pixels includes: a first electrode being light-transmitting; a first light-emitting structural block located on the first electrode; and a second electrode located on the first light-emitting structural block; wherein at least one pixel driving circuit configured to drive the first sub-pixels to emit light is arranged outside of the transparent display area, and a separating area is arranged between an area where the at least one pixel driving circuit is arranged and the transparent display area.

A second aspect of the present application provides a display panel, including: a transparent display area, where the transparent display area includes a plurality of first pixel units, each of the first pixel units includes a plurality of first sub-pixels, and each of the first sub-pixels includes: a first electrode being light-transmitting, a first light-emitting structural block located on the first electrode, and a second electrode located on the first light-emitting structural block; and a non-transparent display area; wherein at least one pixel driving circuit configured to drive the first sub-pixels to emit light is arranged outside of the transparent display area, and a separating area is arranged between an area where the at least one pixel driving circuit is arranged and the transparent display area.

A third aspect of the present application provides a display panel, including: a transparent display area, wherein the transparent display area includes a plurality of first pixel units, each of the first pixel units includes a plurality of first sub-pixels, and each of the first sub-pixels includes: a first electrode being light-transmitting, a first light-emitting structural block located on the first electrode, and a second electrode located on the first light-emitting structural block; a non-transparent display area; and a transition display area arranged between the transparent display area and the non-transparent display area, wherein the transition display area includes a plurality of second pixel units, each of the second pixel units includes a plurality of second sub-pixels, and each of the second sub-pixels includes: a third electrode being not light-transmitting, a second light-emitting structural block located on the third electrode, and a fourth electrode located on the second light-emitting structural block; wherein at least one pixel driving circuit configured to drive the first sub-pixels and/or at least one second sub-pixel to emit light is arranged outside of the transparent display area, and a separating area is arranged between an area where the at least one pixel driving circuits is arranged and the transparent display area.

The beneficial effects of this application are as follows:

A separating area is arranged between a transparent display area and an area where at least one pixel driving circuit configured to drive first sub-pixels in the transparent display area to emit light are arranged, which can prevent that when the first sub-pixels in the transparent display area are emitting light, the light is reflected by a surface of a substrate and enters the at least one pixel driving circuit, for example, at least one pixel circuit for driving the first sub-pixels in an area adjacent to the transparent display area, avoid affecting a mobility of carriers in a channel of a transistor, and cause a threshold voltage to fluctuate, thereby preventing a display Mura problem resulted therefrom, and improving the display effect.

In an alternative solution, a separating area is provided with at least one pseudo transistor and/or at least one pseudo storage capacitor. When the at least one pseudo transistor is provided, the at least one pseudo transistor is not electrically connected with at least one signal line or the first sub-pixels. When the at least one pseudo storage capacitor is provided, the at least one pseudo storage capacitor is not electrically connected with the at least one signal line or the first sub-pixels. In other words, a) although the at least one pseudo transistor and/or the at least one pseudo storage capacitor can be electrically connected with the first sub-pixels, there is no signal (including a scanning signal, a data signal, etc.), so that the first sub-pixels cannot emit light; or b) although the at least one pseudo transistor and/or the at least one pseudo storage capacitor can be connected with the at least one signal line (the at least one signal line includes at least one scanning signal line, at least one data signal line, etc.), the at least one pseudo transistor and/or the at least one pseudo storage capacitor are not electrically connected with the first sub-pixels, so that the first sub-pixels cannot emit light. The at least one pseudo transistor and/or the at least one pseudo storage capacitor can prevent poor processing uniformity caused by structural mutation between a transparent display area and an area where the at least one pixel driving circuit is arranged during manufacturing of a display panel.

In an alternative solution, a separating area is provided with a multi-layer structure. Each of the at least one pixel driving circuit includes at least one transistor and at least one storage capacitor. Each of the at least one transistor includes a gate insulation layer. Each of the at least one storage capacitor includes a capacitor dielectric layer. The multi-layer structure includes the gate insulation layer and the capacitor dielectric layer. In other words, the separating area can be provided with other layer structures as long as the separating area is not provided with any pixel driving circuit connected with pixels and driving the pixels to emit light.

A display panel can include a non-transparent display area, and a transition display area arranged between a transparent display area and the non-transparent display area. The transition display area includes a plurality of second pixel units. Each of the second pixel units includes a plurality of second sub-pixels. The transition display area includes a first transition display area and a second transition display area. The first transition display area is located between the transparent display area and the second transition display area, and the first transition display area is the separating area. In other words, the separating area can be provided with pixels for display, but the separating area cannot be provided with pixel driving circuits.

In an alternative solution, a driving mode of the second sub-pixels in the first transition display area and the second transition display area is active driving mode, and at least one pixel driving circuit connected with the second sub-pixels is arranged in the second transition display area. This alternative solution can prevent that when the first sub-pixels in the transparent display area are emitting light, a display brightness of a part of rows or columns of pixels in the first transition display area and the second transition display area is greater or lower than that of the rest of rows or columns of pixels in the first transition display area and the second transition display area, thus preventing display Mura problem of the transition display area.

DETAILED DESCRIPTION OF THE EMBODIMENTS

In order to make the objectives, features and advantages of this application more obvious and understandable, specific embodiments of the application will be described in detail below with reference to the drawings.

Figure 1:
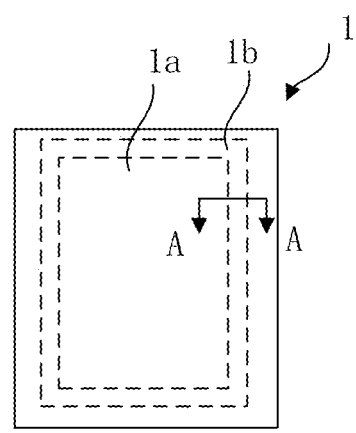
FIG. 1 is a top view illustrating a transparent display panel according to embodiments of the present application.
Figure 2:
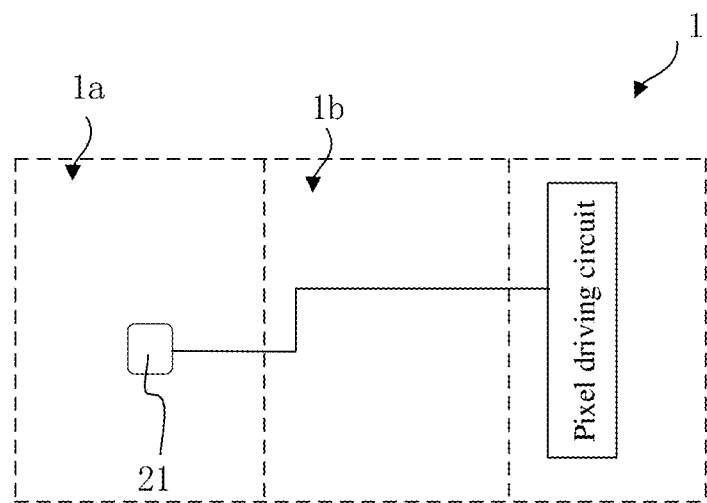
FIG. 2 is a schematic diagram illustrating positions for arranging a first sub-pixel and its connected pixel driving circuit in a transparent display area in FIG. 1.
Figure 3:
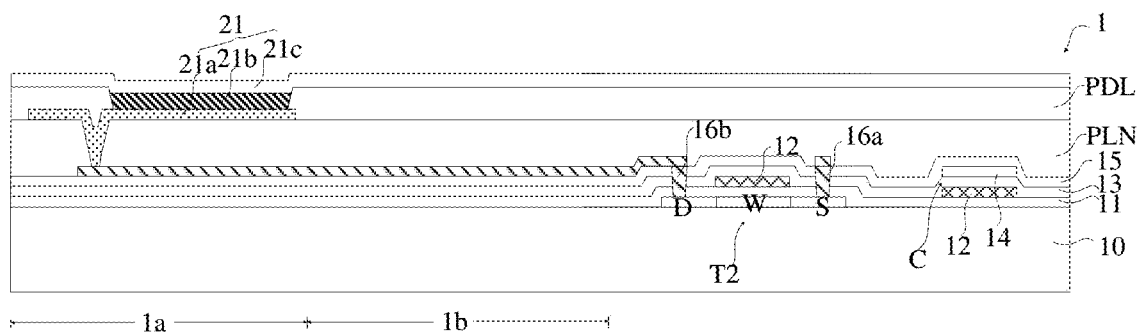
FIG. 3 is a cross-sectional view taken along line AA in FIG. 1.
Figure 4:
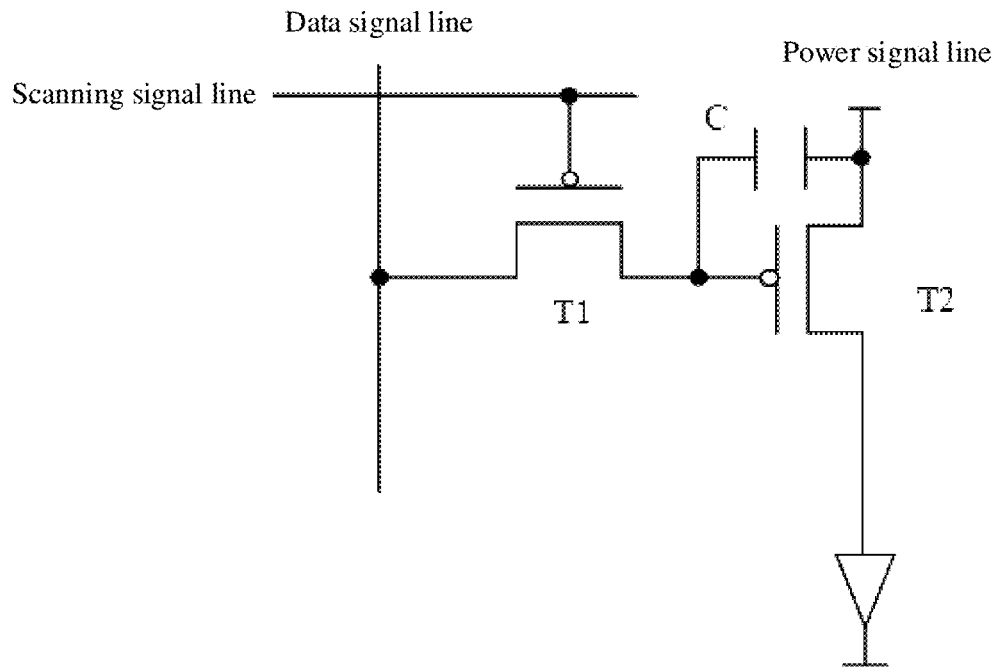
FIG. 4 is a circuit diagram illustrating a pixel driving circuit with a 2T1C structure.

FIG. 1 is a top view illustrating a transparent display panel according to embodiments of the present application. FIG. 2 is a schematic diagram illustrating positions for arranging a first sub-pixel and a pixel driving circuit connected thereto in a transparent display area in FIG. 1. FIG. 3 is a cross-sectional view taken along line AA in FIG. 1. FIG. 4 is a circuit diagram illustrating a pixel driving circuit with a 2T1C structure.

Referring to FIGS. 1 to 3, a transparent display panel 1 includes a transparent display area 1a. The transparent display area 1a includes a plurality of first pixel units. Each of the first pixel units includes a plurality of first sub-pixels 21. Each of the first sub-pixels 21 includes a first electrode 21a, a first light-emitting structural block 21b located on the first electrode 21a, and a second electrode 21c located on the first light-emitting structural block 21b. The first electrode 21a is light-transmitting. At least one pixel driving circuit for driving the first sub-pixels 21 to emit light is arranged outside of the transparent display area 1a. A separating area 1b is arranged between an area where the at least one pixel driving circuit is arranged and the transparent display area 1a.

Referring to FIG. 3, the transparent display area 1a includes: a substrate 10, a gate insulation layer 11, a capacitor dielectric layer 13, a passivation layer 15, connecting lines, a planarization layer PLN, first electrodes 21a, first light-emitting structural blocks 21b and second electrodes 21c which are stacked from bottom to top. The first light-emitting structural blocks 21b are arranged in openings in a pixel defining layer PDL. The planarization layer PLN has through holes to be filled with a conductive material to connect the first electrodes 21a with the connecting lines. Each of the first sub-pixels 21 includes a first electrode 21a, a first light-emitting structural block 21b and a second electrode 21c. Color of light emitting from the first light-emitting structural block 21b can be red, green or blue; and also can be red, green, blue or yellow. One first pixel unit includes a plurality of first sub-pixels 21 respectively emitting red light, green light and blue light; and one first pixel unit also can include a plurality of first sub-pixels 21 respectively emitting red light, green light, blue light and yellow light. In other optional solutions, the first sub-pixels 21 also can emit light of a single color. The first light-emitting structural block 21b can be an Organic Light-Emitting material layer (for example, Organic Light-Emitting Diode, OLED). The first electrode 21a can be an anode, and it is a light-transmitting anode and made from, for example, Indium Tin Oxide (ITO). The second electrode 21c is partially light-transmitting and partially light-reflecting, and it is made from, for example, one or a mixture of magnesium and silver. The second electrodes 21c of all first sub-pixels 21 can be connected to form a planar electrode.

The substrate 10 is a light-transmitting substrate. The light-transmitting substrate can be a flexible substrate or a rigid substrate. A material of the flexible substrate can be polyimide. A material of the rigid substrate can be glass.

An area where the at least one pixel driving circuit is arranged includes: the substrate 10, an active layer (including a source region S, a drain region D and a channel region W between the source region S and the drain region D), the gate insulation layer 11, the gate electrode 12 (i.e., a lower electrode plate), the capacitor dielectric layer 13, an upper electrode plate 14, the passivation layer 15, the planarization layer PLN, the pixel defining layer PDL and a second electrode material layer which are stacked from bottom to top. A transistor T2 includes the active layer (including the source region S, the drain region D and the channel region W between the source region S and the drain region D), the gate insulation layer 11 and the gate electrode 12. A storage capacitor C includes the lower electrode plate 12, the capacitor dielectric layer 13 and the upper electrode plate 14. The passivation layer 15, the capacitor dielectric layer 13 and the gate insulation layer 11 are formed with through holes exposing the source region S and the drain region D, respectively, so as to be filled with a conductive material to form one or more source electrodes 16a and one or more drain electrodes 16b. The one or more source electrodes 16a and the one or more drain electrodes 16b can be formed synchronously with the connection lines. In some embodiments, the active layer can be made from polysilicon. In other words, the transistor T2 can be a silicon thin film transistor based on Low Temperature Polysilicon (LTPS) technology. In other embodiments, the active layer can be an oxide layer, that is, the transistor T2 can be a semiconductor oxide transistor based on Low Temperature Polycrystalline Oxide (LTPO) technology.

The separating area 1b includes: the substrate 10, the gate insulation layer 11, the capacitor dielectric layer 13, the passivation layer 15, the connecting lines, the planarization layer PLN, the pixel defining layer PDL and the second electrode material layer which are stacked from bottom to top.

The first sub-pixels 21 are connected with the at least one pixel driving circuit, and thus they are Active Matrix OLED, AMOLED. The active driving mode of light-emitting mode is implemented through the at least one pixel driving circuit. Each of the at least one pixel driving circuit includes a transistor array and a storage capacitor. AMOLED uses the transistor array to control each pixel to emit light, and each pixel can emit light continuously. In other words, addressing of each first sub-pixel 21 is directly controlled by the transistor array. A row selection signal of the transistor array can be derived from a scanning signal channel of a circuit of gate in panel (GIP), and a column selection signal of the transistor array can be derived from a data signal channel of a display driver integrated circuit (DDIC).

In FIG. 4, each of the at least one pixel driving circuit includes a switching transistor T1, a driving transistor T2 and a storage capacitor C. A data signal line can be connected with the data signal channel (source line) of the display driver integrated circuit (DDIC). A scanning signal line can be connected with a row scanning signal channel of the GIP circuit. A power signal line can be connected with a power voltage. In each of the first sub-pixels 21, the first electrode 21a is connected with the drain electrode of the driving transistor T2 in one of the at least one pixel driving circuit, and the second electrode 21c is grounded.

In other embodiments, each of the at least one pixel driving circuit can be other structures such as 3T1C (on the basis of 2T1C, a transistor that controls a turn-off of a driving current is added between the driving transistor and the pixels), or 7T1C having a threshold voltage compensation, or 6T1C (on the basis of 7T1C, the transistor that controls the turn-off of the driving current is omitted between the driving transistor and the pixels). The specific structure of the at least one pixel driving circuit is not limited in this embodiment.

In FIG. 1, a shape of the transparent display area 1a is rectangular. In other embodiments, the shape of the transparent display area 1a can be circular, elliptical, drop-shaped, notch-shaped or the like. The shape of the transparent display area 1a is not limited in this embodiment.

In addition, in FIG. 1, the separating area 1b surrounds the transparent display area 1a to form a closed ring. In an embodiment, the separating area 1b can surround the transparent display area 1a to form a non-closed ring. In another embodiment, the separating area 1b can be arranged on at least one of left side, right side, upper side or lower side of the transparent display area 1a.

Figure 5:
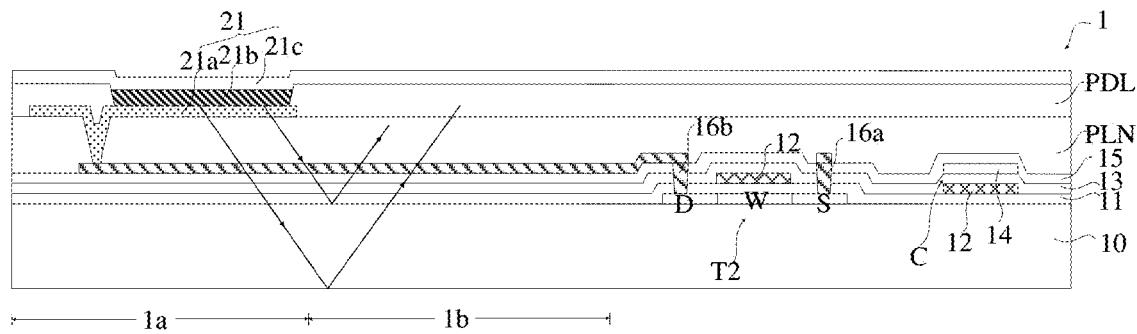
FIG. 5 is a diagram illustrating a state of the transparent display panel in FIG. 1 when the display panel is displaying.

FIG. 5 is a diagram illustrating a state of the transparent display panel in FIG. 1 when the transparent display panel is displaying.

Referring to FIGS. 2, 3 and 5, when a driving voltage is applied between the first electrode 21a and the second electrode 21c, the first light-emitting structural block 21b emits light. The light emitted from the first light-emitting structural block 21b is reflected by surfaces of the substrate 10 (including an upper surface and a lower surface) and enters the separating area 1b. At this time, if the pixel driving circuits corresponding to a plurality of the first sub-pixels 21 is arranged in the separating area 1b, and the pixel driving circuits of a rest of the first sub-pixels 21 are arranged in an area that is immediately adjacent to the separating area 1b, photo-generated carriers will be generated in a channel of a transistor (such as the driving transistor T2 and/or the switching transistor T1) in the separating area 1b, compared with carriers in a channel of a transistor in the area that is immediately adjacent to the separating area 1b and not illuminated by light, there will exist a case that carrier mobility becomes larger or smaller, causing a threshold voltage of the transistor to fluctuate and in turn leading to a display Mura problem. In this embodiment, the pixel driving circuits corresponding to the first sub-pixels 21 are moved outward from the separating area 1b, which can prevent light emitted by the first sub-pixels 21 reflected by the substrate 10 from causing the mobility of carriers in the channel to change and the threshold voltage of the transistor to fluctuate, thereby achieving a uniform display of the transparent display area 1a.

It can be known that the thicker a thickness of the substrate 10 is, the greater a width of the separating area 1b is. In addition, the width of the separating area 1b is also related to a brightness of the transparent display area 1a (i.e., an intensity of the reflected light), a light transmittance of a layer in the transparent display area 1a (i.e., an amount of light which is transmitted from the transparent display area 1a to the substrate 10) and other factors. Exemplarily, the width of the separating area 1b is greater than 50 μm. In an example, the width is greater than 80 μm. In an example, the width is greater than 100 μm.

Figure 6:
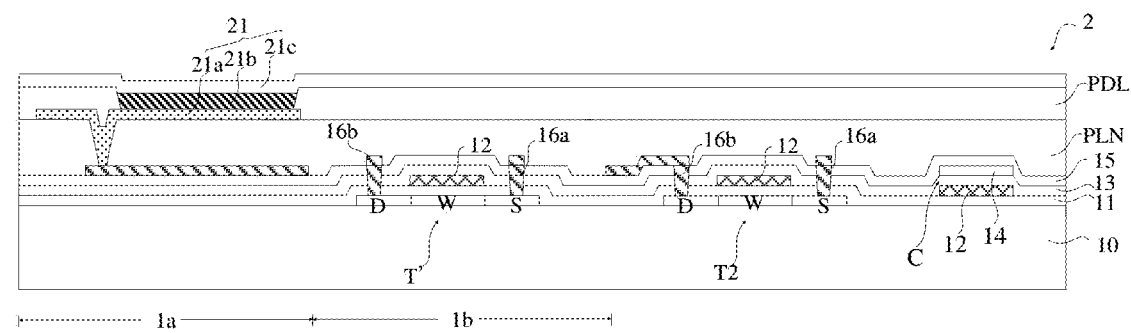
FIG. 6 is a schematic diagram illustrating a cross-sectional structure of a transparent display panel according to embodiments of the present application, where a separating area is provided with a pseudo transistor and/or a pseudo storage capacitor.

FIG. 6 is a schematic diagram illustrating a cross-sectional structure of a transparent display panel according to embodiments of the present application. Referring to FIGS. 6 and 3, a transparent display panel 2 in this embodiment is substantially the same as the transparent display panel 1 in FIGS. 1 to 5, except that the separating area 1b is provided with at least one pseudo transistor T' and/or at least one pseudo storage capacitor. When the at least one pseudo transistor T' is provided, the at least one pseudo transistor T' is not electrically connected with at least one signal line and/or the first sub-pixels 21. When the at least one pseudo storage capacitor is provided, the at least one pseudo storage capacitor is not electrically connected with the at least one signal line and/or the first sub-pixels 21.

The above-mentioned signal line includes at least one scanning signal line, at least one data signal line and so on. When the at least one pseudo transistor T' and/or the at least one pseudo storage capacitor are/is electrically connected with the first sub-pixels 21, there is no scanning signal, no data signal, etc., so that the first sub-pixels 21 cannot emit light. When the at least one pseudo transistor T' and/or the at least one pseudo storage capacitor are/is connected with the at least one scanning signal line, at least one the data signal line, etc., the at least one pseudo transistor T' and/or the at least one pseudo storage capacitor are/is not electrically connected with the first sub-pixels 21, so that the first sub-pixels 21 cannot emit light.

Since the at least one pseudo transistor T' is not electrically connected with the at least one signal line and/or the first sub-pixels 21, even if light emitted from the first light-emitting structural block 21b of each of the first sub-pixels 21 is reflected by surfaces (including an upper surface and a lower surface) of the substrate 10 and enters the at least one pseudo transistor T' to cause the mobility of carriers in the channel to change, it will not cause uneven display.

The at least one pseudo transistor T' and/or the at least one pseudo storage capacitor can prevent poor processing uniformity caused by a structural mutation of the transparent display area 1a and an area where the at least one pixel driving circuit is arranged during manufacturing of the transparent display panel 2. For example, in the dry etching process, if the structural mutation exists, a densely patterned area has a low plasma concentration, and a sparsely patterned area has a high plasma concentration, resulting in an uneven etching degree in a same dry etching time period.

Optionally, at least one pseudo pixel driving circuits is arranged in the separating area 1b, and the at least one pseudo pixel driving circuit is not electrically connected with any signal line and/or the first sub-pixels 21, so that a smooth gradation of a structure between the transparent display area 1a and the area where the at least one pixel driving circuits is arranged can be further improved, and the processing uniformity can be increased. The at least one pseudo pixel driving circuit can be provided in a plurality of rows or a plurality of columns.

In another embodiment, the at least one pseudo pixel driving circuit arranged in the separating area 1b is the same as the at least one pixel driving circuit, but do not use for driving pixels. According to this embodiment, the processing compatibility can be improved, which facilitates the reduction in manufacturing cost.

Figure 7:
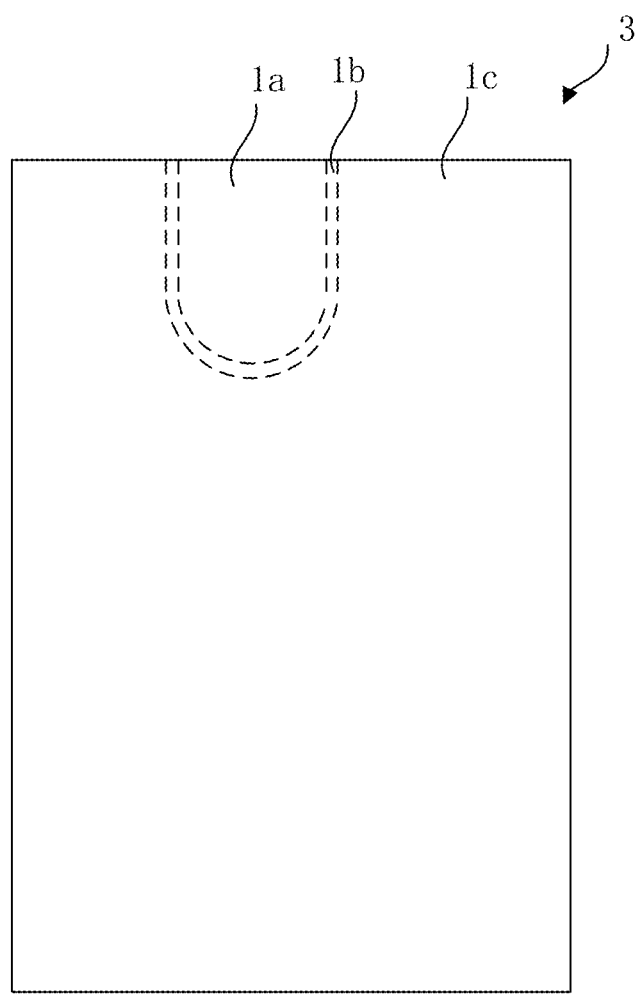
FIG. 7 is a top view illustrating a display panel according to embodiments of the present application, where the display panel includes a transparent display area and a non-transparent display area.

FIG. 7 is a top view illustrating a display panel according to embodiments of the present application.

Referring to FIG. 7 and FIGS. 1 to 4, a display panel 3 includes a transparent display area 1a and a non-transparent display area 1c. The transparent display area 1a includes a plurality of first pixel units. Each of the first pixel units includes a plurality of first sub-pixels 21. Each of the first sub-pixels 21 includes a first electrode 21a, a first light-emitting structural block 21b located on the first electrode 21a, and a second electrode 21c located on the first light-emitting structural block 21b. The first electrode 21a is light-transmitting. At least one pixel driving circuit for driving the first sub-pixels 21 to emit light is arranged outside of the transparent display area 1a, for example, in the non-transparent display area 1c, and a separating area 1b is arranged between an area where the at least one pixel driving circuit is arranged and the transparent display area 1a.

The display panel 3 is a full screen. Positions and structures of the transparent display area 1a, the separating area 1b and the at least one pixel driving circuit can refer to that in the transparent display panels 1 and 2, and will not be described here in detail again.

Figure 8:
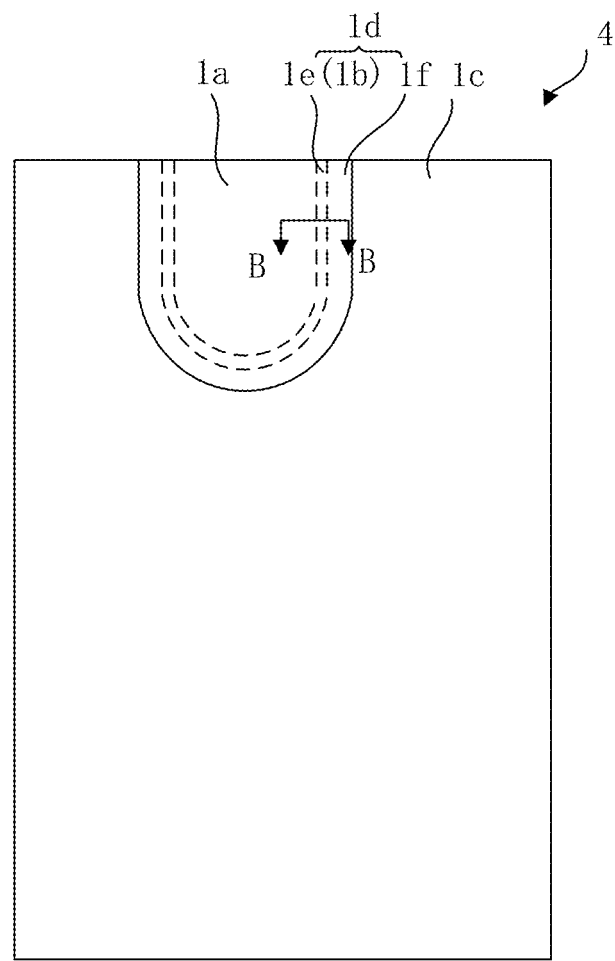
FIG. 8 is a top view illustrating a display panel according to embodiments of the present application, where a transition display area is arranged between a transparent display area and a non-transparent display area.
Figure 9:
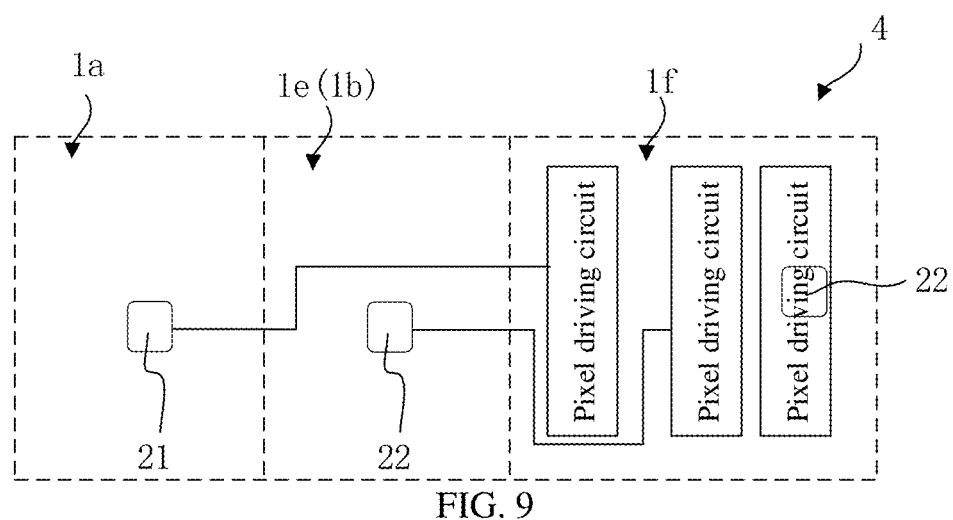
FIG. 9 is a schematic diagram illustrating positions for arranging sub-pixels and their connected pixel driving circuits in each area in FIG. 8.
Figure 10:
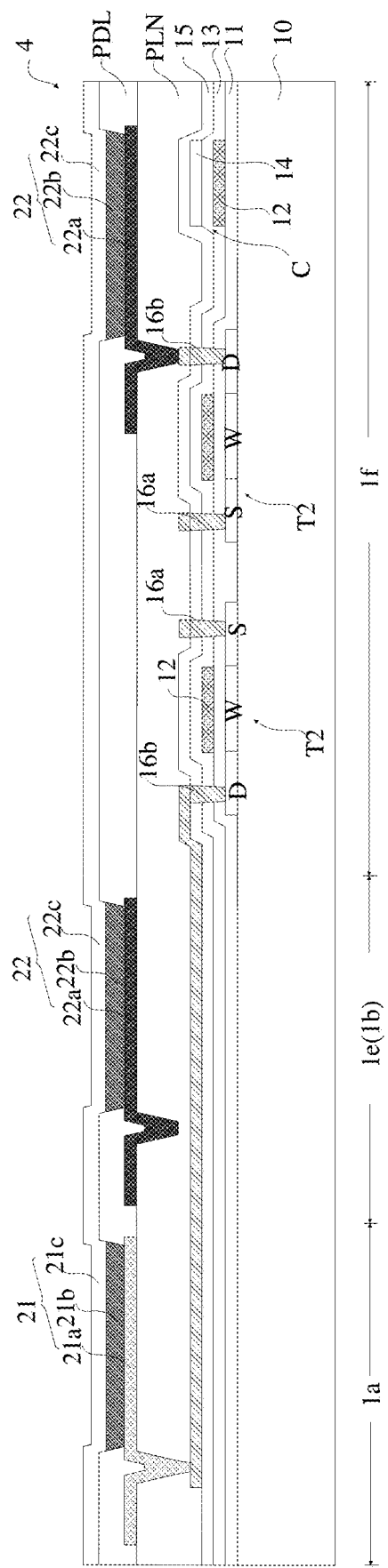
FIG. 10 is a cross-sectional view taken along line BB in FIG. 8.

FIG. 8 is a top view illustrating a display panel according to embodiments of the present application. FIG. 9 is a schematic diagram illustrating positions for arranging sub-pixels and their connected pixel driving circuits in each area in FIG. 8. FIG. 10 is a cross-sectional view taken along line BB in FIG. 8.

Referring to FIGS. 8 to 10, a display panel 4 in this embodiment is substantially the same as the display panel 3 in FIG. 7, except that a transition display area 1d is arranged between a transparent display area 1a and a non-transparent display area 1c. The transition display area 1d includes a plurality of second pixel units. Each of the second pixel units includes a plurality of second sub-pixels 22. Each of the second sub-pixels 22 includes a third electrode 22a, a second light-emitting structural block 22b located on the third electrode 22a, and a fourth electrode 22c located on the second light-emitting structural block 22b. The third electrode 22a is not light-transmitting. The transition display area 1d includes a first transition display area 1e and a second transition display area 1f. The first transition display area 1e is located between the transparent display area 1a and the second transition display area 1f. The first transition display area 1e is the separating area 1b, and at least one pixel driving circuit connected with the first sub-pixels 21 is arranged in the second transition display area 1f.

Referring to FIG. 10, the first transition display area 1e includes: the substrate 10, the gate insulation layer 11, the capacitor dielectric layer 13, the passivation layer 15, the connecting lines, the planarization layer PLN, the third electrodes 22a, the second light-emitting structural blocks 22b, and the fourth electrodes 22c which are stacked from bottom to top. Each of the second sub-pixels 22 includes the third electrode 22a, the second light-emitting structural block 22b and the fourth electrode 22c. Color of light emitting from the second light-emitting structural block 22b can be red, green or blue; and also can be red, green, blue or yellow. One second pixel unit includes a plurality of second sub-pixels 22 respectively emitting red light, green light and blue light; and one second pixel unit also can include a plurality of second sub-pixels 22 respectively emitting red light, green light, blue light and yellow light. In other optional solutions, the second sub-pixels 22 can all emit light of a single color. The second light-emitting structural block 22b can be an organic light-emitting material layer (for example, OLED layer). The third electrode 22a is a light-reflecting anode, for example, has a laminated structure of ITO, silver and ITO. The fourth electrode 22c is partially light-transmitting and partially light-reflecting, but its light transmittance is lower than that of the second electrode 21c, and the fourth electrode 22c is made from, for example, one or a mixture of magnesium and silver. The fourth electrodes 22c of all second sub-pixels 22 can be connected to form a planar electrode.

Referring to FIG. 10, the second transition display area 1f includes: the substrate 10, the active layer (including the source region S, the drain region D and the channel region W between the source region S and the drain region D), the gate insulation layer 11, the gate electrodes 12 (i.e., lower electrode plates), the capacitor dielectric layer 13, the upper electrode plates 14, the passivation layer 15, the planarization layer PLN, the third electrodes 22a, the second light-emitting structural blocks 22b and the fourth electrodes 22c which are stacked from bottom to top. A transistor T2 includes the active layer (including the source region S, the drain region D and the channel region W between the source region S and the drain region D), the gate insulation layer 11 and the gate electrode 12. A storage capacitor C includes the gate electrode 12, the capacitor dielectric layer 13 and the upper electrode plate 14. The passivation layer 15, the capacitor dielectric layer 13 and the gate insulation layer 11 are formed with through holes exposing the source region S and the drain region D, respectively, so as to be filled with a conductive material to form source electrodes 16a and e drain electrodes 16b. The source electrodes 16a and the drain electrodes 16b can be formed synchronously with the connecting lines. In some embodiments, the active layer can be made from polysilicon. In other words, the transistor T2 can be a silicon thin film transistor based on Low Temperature Polysilicon (LTPS) technology. In other embodiments, the active layer can be an oxide layer, that is, the transistor T2 can be a semiconductor oxide transistor based on the Low Temperature Polycrystalline Oxide (LTPO) technology.

The second sub-pixels 22 can be Active Matrix OLEDs, AMOLEDs. A structure of each of the at least one pixel driving circuit connected with the second sub-pixels 22 can refer to that of each of the at least one pixel driving circuit connected with the first sub-pixels 21. The structure of each of the at least one pixel driving circuit connected with the second sub-pixels 22 and the structure of each of the at least one pixel driving circuit connected with the first sub-pixels 21 can be completely the same or different.

In each of the second sub-pixels 22, the third electrode 22a is connected with a drain electrode of the driving transistor T2 in each of the at least one pixel driving circuit, and the fourth electrode 22c is grounded.

Referring to FIG. 9, the at least one pixel driving circuit corresponding to the first sub-pixels 21 in the transparent display area 1a and the at least one pixel driving circuit corresponding to the second sub-pixels 22 in the first transition display area 1e are both arranged in the second transition display area 1f. The at least one pixel driving circuit corresponding to the second sub-pixels 22 in the second transition display area 1f is arranged in the second transition display area 1f.

Figure 11:
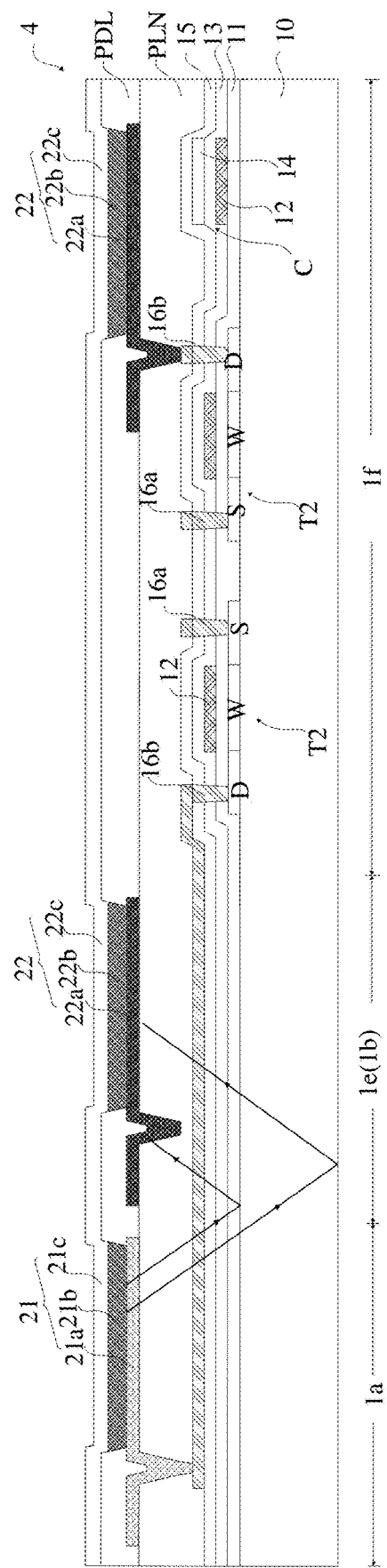
FIG. 11 is a diagram illustrating a state of the display panel in FIG. 8 when the display panel is displaying.

FIG. 11 is a diagram illustrating a state of the display panel in FIG. 8 when the display panel is displaying.

Referring to FIGS. 9 and 11, when a driving voltage is applied between the first electrode 21a and the second electrode 21c, the first light-emitting structural block 21b emits light. The light emitted from the first light-emitting structural block 21b is reflected by surfaces of the substrate 10 (including the upper surface and the lower surface) and enters the first transition display area 1e (i.e., the separating area 1b). At this time, if the pixel driving circuits corresponding to a plurality of the first sub-pixels 21 are arranged in the first transition display area 1e, and the pixel driving circuits corresponding to a rest of the first sub-pixels 21 are arranged in the second transition display area 1f, photo-generated carriers will be generated in a channel of a transistor (such as the driving transistor T2 and/or the switching transistor T1) in the first transition display area 1e, compared with carriers in a channel of a transistor in the second transition display area 1f, there will exist a case that carrier mobility becomes larger or smaller, causing a threshold voltage of the transistor to fluctuate and in turn leading to a display Mura problem. In this embodiment, at least one pixel driving circuit corresponding to the first sub-pixels 21 is moved from the first transition display area 1e to the second transition display area 1f, which can prevent light emitted from the first sub-pixels 21 and then reflected by the substrate 10 from causing the mobility of carriers in the channel to change and the threshold voltage of the transistor to fluctuate, thereby achieving a uniform display of the transparent display area 1a.

In addition, at least one pixel driving circuit corresponding to the second sub-pixels 22 in the first transition display area 1e and at least one pixel driving circuit corresponding to the second sub-pixels 22 in the second transition display area 1f are arranged in the second transition display area 1f, which, compared with a solution in which the at least one pixel driving circuit corresponding to the second sub-pixels 22 in the first transition display area 1e is arranged in the first transition display area 1e, and the at least one pixel driving circuit corresponding to the second sub-pixels 22 in the second transition display area 1f is arranged in the second transition display area 1f, the present solution can prevent the light emitted from the first sub-pixels 21 and then reflected by the substrate 10 from causing the mobility of carriers in the channel of the transistor in the first transition display area 1e to change and the threshold voltage of the transistor to fluctuate, thereby preventing the uneven brightness of the second sub-pixels 22 when the second sub-pixels 22 are displaying.

The transparent display area 1a is not provided with the at least one pixel driving circuit, which can increase a light transmittance of the transparent display area 1a when the first sub-pixels 21 are not driven. The at least one pixel driving circuit corresponding to the first sub-pixels 21 is moved to the second transition display area 1f, compared with moving to the non-transparent display area 1c, the present solution can avoid reducing a pixel density (Pixels Per Inch, referred to as PPI) of the non-transparent display area 1c, and improve the overall display effect of the display panel 4 as a full screen.

In other embodiments, the second sub-pixels 22 in the first transition display area 1e and/or the second transition display area 1f can be Passive Matrix OLEDs (PMOLEDs). In a passive driving mode of light-emitting, anodes and cathodes simply form an array (matrix shape), and pixels at intersections of rows and columns in the array are lit up in a scanning manner. Each pixel is operated in a short pulse mode, and emits light with instant high brightness. In other words, addressing of each second sub-pixel 22 is directly controlled by an external circuit. The external circuit can be a display driver integrated chip (DDIC). At this time, the second transition display area 1f can be provided only with the at least one pixel driving circuit corresponding to the first sub-pixels 21.

In FIG. 8, a shape of the transparent display area 1a is drop-shaped. One side of the transparent display area 1a is adjacent to a bezel, and the other sides are close to the non-transparent display area 1c. Therefore, the first transition display area 1e partially surrounds the transparent display area 1a to form a non-closed ring. In another embodiment, the transparent display area 1a can be arranged in the non-transparent display area 1c, at this time, the first transition display area 1e surrounds the transparent display area 1a to form a closed ring. In still another embodiment, the first transition display area 1e can be arranged on at least one of left side, right side, upper side or lower side of the transparent display area 1a.

In other embodiments, the shape of the transparent display area 1a can be rectangular, circular, elliptical, notch-shaped or the like. In this embodiment, the shape of the transparent display area 1a is not limited.

Illustratively, the first transition display area 1e has a width greater than 50 μm. In an embodiment, the width of the first transition display area is greater than 80 μm. In an embodiment, the width of the first transition display area is greater than 100 μm.

Figure 12:
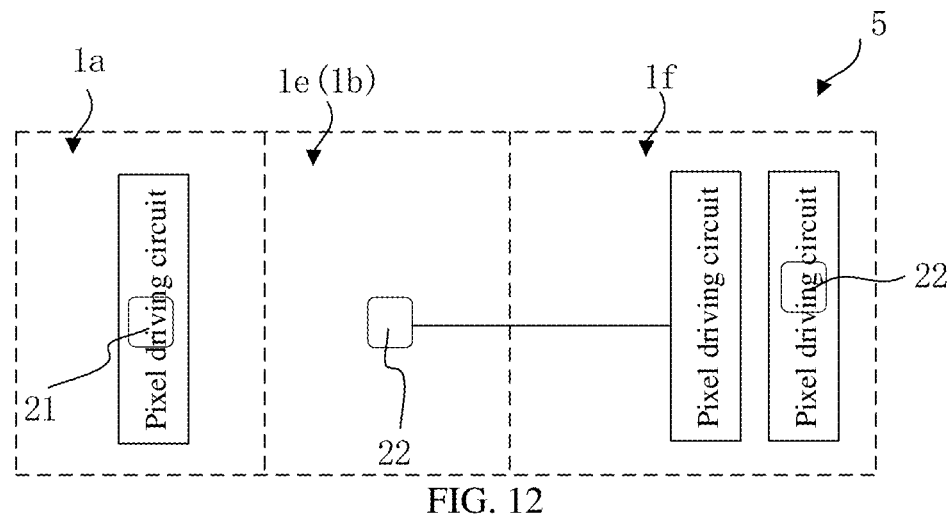
FIG. 12 is a schematic diagram illustrating positions for arranging pixels and their connected pixel driving circuits in each area of a display panel according to embodiments of the present application, where a pixel driving circuit for the first sub-pixel is provided in a transparent display area.

FIG. 12 is a schematic diagram illustrating positions for arranging pixels and their connected pixel driving circuits in each area of a display panel according to embodiments of the present application.

Referring to FIGS. 12 and 9, a display panel 5 in this embodiment is substantially the same as the display panel 4 in FIGS. 8 to 11, except that the at least one pixel driving circuit corresponding to the first sub-pixels 21 is arranged in the transparent display area 1a.

In this embodiment, each of the first sub-pixels 21 of the transparent display area 1a, when driven, is in a light-emitting state, so that an influence on a mobility of carriers of a transistor in each pixel driving circuit is uniform. Therefore, uneven brightness will not occur in the transparent display area 1a. It can be understood that whether the transistor in the pixel driving circuit is a silicon thin film transistor or a semiconductor oxide transistor, its influence on the mobility of carriers in the channel of the transistor electrically connected with each first sub-pixel 21 is uniform, and the uneven brightness will not occur in the transparent display area 1a.

In addition, the at least one pixel driving circuit corresponding to the second sub-pixels 22 in the first transition display area 1e and the at least one pixel driving circuit corresponding to the second sub-pixels 22 in the second transition display area 1f are arranged in the second transition display area 1f, which can prevent uneven brightness of the second sub-pixels 22 when the second sub-pixels 22 are displaying.

Figure 13:
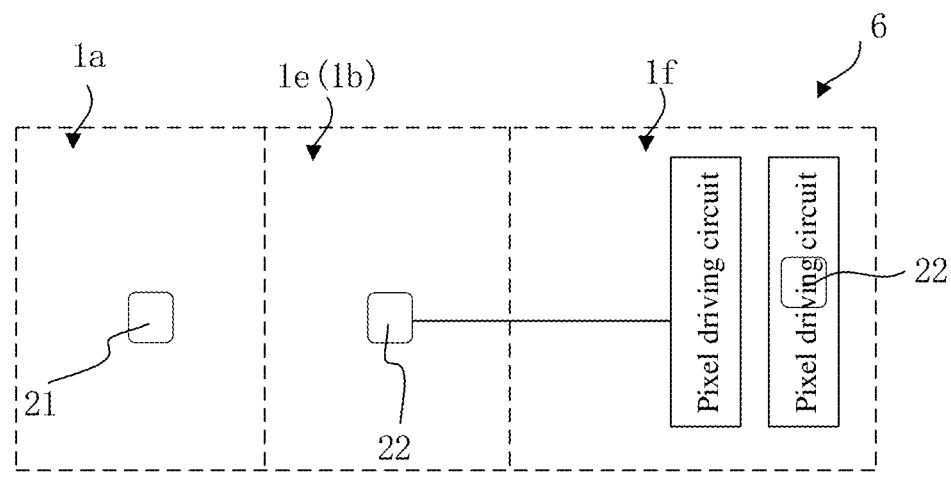
FIG. 13 is a schematic diagram illustrating positions for arranging pixels and their connected pixel driving circuits in each area of a display panel according to embodiments of the present application, where first sub-pixels are in a passive driven light-emitting mode.

FIG. 13 is a schematic diagram illustrating positions for arranging pixels and their connected pixel driving circuits in each area of a display panel according to embodiments of the present application.

Referring to FIGS. 13 and 9, a display panel 6 in this embodiment is substantially the same as the display panel 4 in FIGS. 8 to 11, except that a driving mode of the first sub-pixels 21 is a passive driving mode, and thereby the first sub-pixels have no corresponding connected pixel driving circuits.

In this embodiment, since the first sub-pixels 21 in the transparent display area 1a do not have correspondingly connected pixel driving circuits, uneven brightness will not occur in the transparent display area 1a. The at least one pixel driving circuit corresponding to the second sub-pixels 22 in the first transition display area 1e and the at least one pixel driving circuit corresponding to the second sub-pixels 22 in the second transition display area 1f are arranged in the second transition display area 1f, which can prevent the uneven brightness of the second sub-pixels 22 when the second sub-pixels 22 are displaying.

Figure 14:
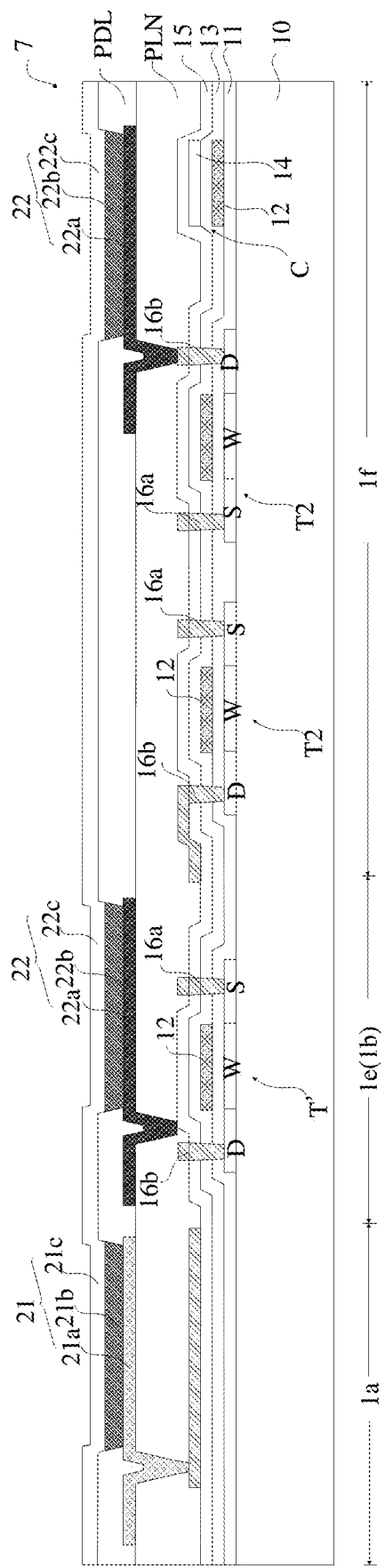
FIG. 14 is a schematic diagram illustrating a cross-sectional structure of a display panel according to embodiments of the present application.

FIG. 14 is a schematic diagram illustrating a cross-sectional structure of a display panel according to embodiments of the present application. Referring to FIGS. 14 and 10, a display panel 7 in this embodiment is substantially the same as the display panel 4 in FIGS. 8 to 11, except that the first transition display area 1e is provided with at least one pseudo transistor T' and/or at least one pseudo storage capacitor. When the at least one pseudo transistor T' is provided, the at least one pseudo transistor T' is not electrically connected with at least one signal line and/or the first sub-pixels 21 and second sub-pixels 22. When the at least one pseudo storage capacitor is provided, the at least one pseudo storage capacitor is not electrically connected with the at least one signal line and/or the first sub-pixels 21 and the second sub-pixels 22.

Signal lines include scanning signal lines, data signal lines and so on. When the at least one pseudo transistor T' and/or the at least one pseudo storage capacitor are/is electrically connected with pixels (the first sub-pixels 21 and/or the second sub-pixels 22), there is no scanning signal, no data signal, etc., so that the pixels cannot emit light. When the at least one pseudo transistor T' and/or the at least one pseudo storage capacitor are/is connected with at least one scanning signal line, at least one data signal line, etc., the at least one pseudo transistor T' and/or the at least one pseudo storage capacitor are/is not electrically connected with any pixel, so that the pixels cannot emit light.

Since the at least one pseudo transistor T' is not electrically connected with the at least one signal line and/or the pixels, even if light emitted from the first light-emitting structural block 21b of the first sub-pixels 21 is reflected by surfaces (including an upper surface and a lower surface) of the substrate 10 and enters the at least one pseudo transistor T' to cause a mobility of carriers in a channel to change, it will not cause uneven display.

The at least one pseudo transistor T' and/or the at least one pseudo storage capacitor can prevent poor processing uniformity caused by a structural mutation of the transparent display area 1a and the second transition display area if during the manufacturing of the display panel 7. For example, in the dry etching process, if the structural mutation exists, a densely patterned area has a low plasma concentration, and a sparsely patterned area has a high plasma concentration, resulting in an uneven etching degree in the same dry etching time period.

Optionally, at least one pseudo pixel driving circuit is arranged in the first transition display area 1e, and the at least one pseudo pixel driving circuit is not electrically connected with at least one signal line and/or the pixels, so that smooth gradation of a structure between the transparent display area 1a and the second transition display area if can be further improved, and the processing uniformity can be increased. The at least one pseudo pixel driving circuit can be provided in a plurality of rows or a plurality of columns.

Optionally, the at least one pseudo pixel driving circuit arranged in the first transition display area 1e is the same as the at least one pixel driving circuit arranged in the second transition display area 1f. According to this embodiment, processing compatibility can be improved, which facilitates reduction in manufacturing cost.

The solution in the above-mentioned embodiments can be combined with each other. For example, embodiments in FIG. 14 can be combined with embodiments in FIGS. 12-13.

Based on the transparent display panels 1 and 2 or the display panels 3, 4, 5, 6 and 7, an embodiment of the present application further provides a display device.

The display device can be a mobile phone, a tablet computer, a car display screen, etc.

The display device includes: a device body having a component area; and any of the transparent display panels 1 and 2 or the display panels 3, 4, 5, 6 and 7 covering the device body. The component area is located below the transparent display panels 1 and 2 or below the transparent display area 1a of the display panels 3, 4, 5, 6 and 7. At least one photosensitive component which is emitting or collecting light passing through the transparent display area 1a is arranged in the component area.

The at least one photosensitive component includes: a camera and/or a light sensor. The light sensor includes one or a combination of an iris recognition sensor and a fingerprint recognition sensor.

Although this application is disclosed as above, the application is not limited thereto. Any person skilled in the art can make various changes and modifications without departing from the spirit and scope of the application. Therefore, the protection scope of the application shall be based on the scope defined by the claims.

The invention claimed is:

1. A transparent display panel, comprising:
   a transparent display area comprising a plurality of first pixel units, and each of the first pixel units comprising a plurality of first sub-pixels, and each of the first sub-pixels comprising:
      a first electrode being light-transmitting;
      a first light-emitting structural block located on the first electrode; and
      a second electrode located on the first light-emitting structural block; and
   at least one pixel driving circuit configured to drive the plurality of first sub-pixels to emit light, wherein the at least one pixel driving circuit is arranged outside of the transparent display area, and a separating area is arranged between an area where the at least one pixel driving circuit is arranged and the transparent display area,
   wherein a transition display area including the separating area is provided outside of the transparent display area, and the transition display area comprises a plurality of second pixel units, each of the second pixel units comprises a plurality of second sub-pixels, each of the second sub-pixels comprises a third electrode, a second light-emitting structural block located on the third electrode and a fourth electrode located on the second light-emitting structural block, wherein the third electrode is not light-transmitting,
   the transition display area comprises a first transition display area and a second transition display area, wherein the first transition display area is located between the transparent display area and the second transition display area, and the first transition display area is the separating area, and the at least one pixel driving circuit connected with the first sub-pixels is arranged in the second transition display area.

2. The transparent display panel according to claim 1, wherein the separating area is provided with at least one pseudo transistor and/or at least one pseudo storage capacitor, the at least one pseudo transistor is not electrically connected with at least one signal line and/or the first sub-pixels, and the at least one pseudo storage capacitor is not electrically connected with the at least one signal line and/or the first sub-pixels.

3. The transparent display panel according to claim 1, wherein
   the separating area is provided with a multi-layer structure, each of the at least one pixel driving circuit comprises at least one transistor and at least one storage capacitor, each of the at least one transistor comprises a gate insulation layer, each of the at least one storage capacitor comprises a capacitor dielectric layer, and the multi-layer structure comprises the gate insulation layer and the capacitor dielectric layer.

4. The transparent display panel according to claim 1, wherein
   the separating area is arranged on at least one of left side, right side, upper side and lower side of the transparent display area; or the separating area is arranged around the transparent display area.

5. The transparent display panel according to claim 1, wherein
   the separating area has a width greater than 50 μm.

6. A display panel, comprising:
   a transparent display area comprising a plurality of first pixel units, and each of the first pixel units comprising a plurality of first sub-pixels, and each of the first sub-pixels comprising:
      a first electrode being light-transmitting,
      a first light-emitting structural block located on the first electrode, and
      a second electrode located on the first light-emitting structural block; and
   a non-transparent display area;
   wherein at least one pixel driving circuit configured to drive the first sub-pixels to emit light is arranged outside of the transparent display area, and a separating area is arranged between an area where the at least one pixel driving circuit is arranged and the transparent display area,
   wherein a transition display area is arranged between the transparent display area and the non-transparent display area, and the transition display area comprises a plurality of second pixel units, each of the second pixel units comprises a plurality of second sub-pixels, each of the second sub-pixels comprises a third electrode, a second light-emitting structural block located on the third electrode and a fourth electrode located on the second light-emitting structural block, wherein the third electrode is not light-transmitting,
   the transition display area comprises a first transition display area and a second transition display area, wherein the first transition display area is located between the transparent display area and the second transition display area, and the first transition display area is the separating area, and the at least one pixel driving circuit connected with the first sub-pixels is arranged in the second transition display area.

7. A display panel, comprising:
   a transparent display area comprising a plurality of first pixel units, and each of the first pixel units comprising a plurality of first sub-pixels, and each of the first sub-pixels comprising:
      a first electrode being light-transmitting,
      a first light-emitting structural block located on the first electrode, and
      a second electrode located on the first light-emitting structural block;
   a non-transparent display area; and
   a transition display area arranged between the transparent display area and the non-transparent display area, the transition display area comprising a plurality of second pixel units, and each of the second pixel units comprising a plurality of second sub-pixels, and each of the second sub-pixels comprising:

a third electrode being not light-transmitting,
a second light-emitting structural block located on the third electrode, and
a fourth electrode located on the second light-emitting structural block;
wherein at least one pixel driving circuit configured to drive the first sub-pixels and/or at least one second sub-pixel to emit light is arranged outside of the transparent display area, and a separating area is arranged between an area where the at least one pixel driving circuit is arranged and the transparent display area.

8. The display panel according to claim 7, wherein the transition display area comprises a first transition display area and a second transition display area, and the first transition display area is located between the transparent display area and the second transition display area, and the first transition display area is the separating area.

9. The display panel according to claim 8, wherein
a driving mode of the second sub-pixels in the first transition display area is an active driving mode, and at least one pixel driving circuit connected with the second sub-pixels in the first transition display area is arranged in the second transition display area; and/or
a driving mode of the second sub-pixels in the second transition display area is an active driving mode, and at least one pixel driving circuit connected with the second sub-pixels in the second transition display area is arranged in the second transition display area.

10. The display panel according to claim 8, wherein a driving mode of the second sub-pixels in the first transition display area and/or the second transition display area is a passive driving mode, and the second transition display area is provided with the at least one pixel driving circuit connected with the first sub-pixels.

11. The display panel according to claim 7, wherein
a driving mode of the first sub-pixels is an active driving mode, and at least one pixel driving circuit connected with the first sub-pixels is arranged in the transparent display area; or
a driving mode of the first sub-pixels is a passive driving mode.

12. The display panel according to claim 7, wherein the separating area is provided with at least one pseudo transistor, the at least one pseudo transistor is not electrically connected with at least one signal line, or the at least one pseudo transistor is not electrically connected with the first sub-pixels and the second sub-pixels.

13. The display panel according to claim 7, wherein the separating area is provided with at least one pseudo storage capacitor, the at least one pseudo storage capacitor is not electrically connected with at least one signal line, or the at least one pseudo storage capacitor is not electrically connected with the first sub-pixels and the second sub-pixels.

14. The display panel according to claim 7, wherein the separating area is provided with at least one pseudo pixel driving circuit, and the at least one pseudo pixel driving circuit enables the first sub-pixels and the second sub-pixels not to emit light.

15. The display panel according to claim 7, wherein the separating area is provided with at least one pseudo pixel driving circuit, and the at least one pseudo pixel driving circuit is the same as the at least one pixel driving circuit.

16. The display panel according to claim 7, wherein the separating area is provided with a multi-layer structure, each of the at least one pixel driving circuit comprises at least one transistor and at least one storage capacitor, the at least one transistor comprises a gate insulation layer, the at least one storage capacitor comprises a capacitor dielectric layer, and the multi-layer structure comprises the gate insulation layer and the capacitor dielectric layer.

17. The display panel according to claim 7, wherein the separating area is arranged on at least one of left side, right side, upper side and lower side of the transparent display area, or the separating area is arranged around the transparent display area.

18. The display panel according to claim 7, wherein
the separating area has a width greater than 50 μm.

* * * * *